US005293392A

United States Patent [19]

Shieh et al.

[11] Patent Number: 5,293,392

[45] Date of Patent: Mar. 8, 1994

[54] TOP EMITTING VCSEL WITH ETCH STOP LAYER

[75] Inventors: Chan-Long Shieh; Donald E. Ackley, both of Paradise Valley, Ariz.

[73] Assignee: Motorola, Inc., Schaumburg, Ill.

[21] Appl. No.: 922,719

[22] Filed: Jul. 31, 1992

[51] Int. Cl.[5] .................... H01S 3/19

[52] U.S. Cl. .................... 372/45; 372/46; 372/96; 372/99; 437/129

[58] Field of Search .................... 372/46, 45, 96, 99; 437/129

[56] References Cited

U.S. PATENT DOCUMENTS 4,830,986 5/1989 Plumb .................... 437/129

5,034,092 7/1991 Lebby et al. .................... 156/646

5,111,467 5/1992 Bradley .................... 372/29

5,115,441 1/1991 Kopf et al. .................... 372/45

FOREIGN PATENT DOCUMENTS 0209782 8/1990 Japan .................... 372/45

0105991 5/1991 Japan .................... 372/45

*Primary Examiner*—Georgia Y. Epps

*Attorney, Agent, or Firm*—Eugene A. Parsons

[57] ABSTRACT

A top emitting vertical cavity surface emitting laser with an etch stop layer positioned in the top mirror stack so the stack can be etched to form a trench surrounding a mesa with the emitting area on the mesa and the trench confining current flow and lasing to the mesa.

26 Claims, 1 Drawing Sheet 25 40 42 36 N+ 30 30 38 22 N 20 34 32 34 18 N 15 12 P 10 P+ 44

TOP EMITTING VCSEL WITH ETCH STOP LAYER

The present invention pertains to vertical cavity surface emitting lasers and more specifically to an improved method of manufacturing such lasers.

BACKGROUND OF THE INVENTION

In general, there are two types of vertical cavity surface emitting lasers (VCSEL), bottom emitting and top emitting. Bottom emitting VCSELs have an emitting area on the back side of the substrate on which they are formed. This type of VCSEL is utilized because of the ease with which the electrical contacts are formed. The top can be covered with an electrical contact and the substrate can be a highly doped semiconductor which renders it conductive. However, in addition to the pure physical constraints (e.g. mounting problems) there are many other limitations as a result of the substrate being in the emitting path.

Prior art top emitting VCSELs are more difficult to construct and include some current limitations as a result of the construction. In top emitting VCSELs a mirror stack is formed on the substrate and an active and spacer layer is formed on the mirror stack. A second mirror stack is placed on the active and spacer layer and an electrical contact is placed on the second mirror stack so as to define an emitting opening therethrough. This configuration produces some current confinement problems and instabilities in the optical emission. However, the top emitting VCSEL has the advantages of; 1) the lasing wavelength is not constrained by the bandgap of the substrate material; and 2) the coupling of the light output to external equipment is not hindered by the substrate for closely packed array applications.

SUMMARY OF THE INVENTION

It is a purpose of the present invention to provide a new and improved method of producing top emitting VCSELs which accurately provides desired optical mode requirements and which includes a current confinement structure for efficient operation.

It is a further purpose of the present invention to provide a new and improved method of producing top emitting VCSELs utilizing an etch stop layer in the manufacturing thereof.

It is a further purpose of the present invention to provide improved top emitting VCSELs.

The above purposes and others are met and the above problems are solved with a method of producing a top emitting vertical cavity surface emitting laser including the steps of providing a substrate having a major surface, forming a first parallel mirror stack on the major surface of the substrate and parallel therewith, forming an active and spacer layer on the first parallel mirror stack, forming a second parallel mirror stack on the active and spacer layer with an emitting surface and a layer of etch stop material positioned within the second parallel mirror stack a predetermined distance from the emitting surface and parallel therewith, and etching a portion of the second parallel mirror stack from the emitting surface to the etch stop layer to define an emitting area.

The above purposes and others are met and the above problems are solved with a top emitting vertical cavity surface emitting laser including an active and spacer layer having first and second opposed major surfaces, a first parallel mirror stack affixed to and parallel with the first major surface and a second parallel mirror stack affixed to and parallel with the second major surface and defining an emitting surface on the second parallel mirror stack opposite the major surface, a layer of etch stop material positioned within the second parallel mirror stack a predetermined distance from the emitting surface and parallel therewith, a portion of the second parallel mirror stack being etched from the emitting surface to the etch stop layer with a remaining portion of the second parallel mirror stack defining an emitting area in the emitting surface, and the remaining portion of the second parallel mirror stack being sufficient to promote lasing therein and the etched portion of the second parallel mirror stack being insufficient to promote lasing therein.

BRIEF DESCRIPTION OF THE DRAWINGS

Referring to the drawings.

DESCRIPTION OF THE PREFERRED EMBODIMENT

Figure 1:
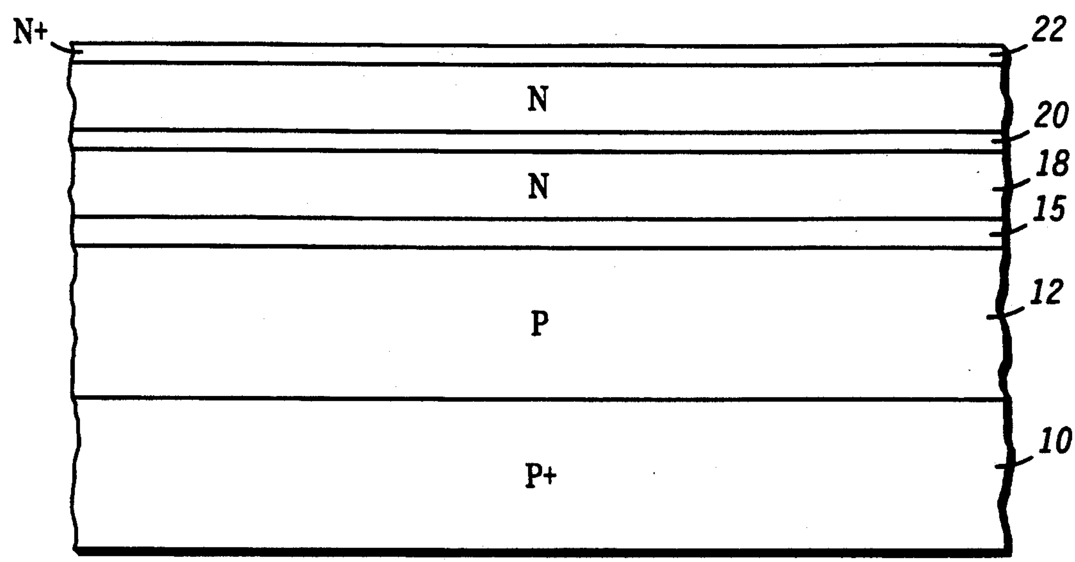
FIG. 1 is a simplified cross sectional view of an intermediate step in the construction of a VCSEL in accordance with the present invention.

Referring specifically to FIG. 1, an intermediate step in the construction of a vertical surface emitting laser (VCSEL) is illustrated. A substrate 10 is provided which in this specific embodiment is formed of gallium arsenide (GaAs) and heavily doped to provide a P type conduction. A parallel mirror stack 12 is formed on the surface of substrate 10 and doped to provide P type conduction. An active and spacer layer 15 is formed on parallel mirror stack 12 and a second parallel mirror stack 18 is formed on layer 15. Parallel mirror stack 18 is doped to provide N type conduction. Parallel mirror stacks 12 and 18 and active and spacer layer 15 are formed in accordance with well known techniques, a typical example of which is described in detail in U.S. Pat. No. 5,034,092, entitled Plasma Etching of Semiconductor Substrates, issued Jul. 23 , 1991 and assigned to the same assignee.

During formation of parallel mirror stack 18, a thin layer 20 of etch stop material is formed at a predetermined depth in parallel mirror stack 18. In this specific embodiment parallel mirror stack 18 is formed of different compositions of aluminum gallium arsenide (AlGaAs) and layer 20 is formed of indium gallium phosphide (InGaP) a few hundred angstroms thick (generally less than 500 angstroms). The position of layer 20 is determined by the requirement for confining the optical mode, as will be apparent presently, and can be placed accurately by the standard growth techniques utilized, such as MOCVD or MBE.

Finally a transparent contact layer 22 is formed on parallel mirror stack 18 and is doped to provide N type conduction. Contact layer 22 is provided to allow the deposition, and subsequent adherence, of a metal contact on the top surface of the laser. It will of course be understood by those skilled in the art that the described structure may be doped to provide different types of conductivity and may include different materials.

Figure 2:
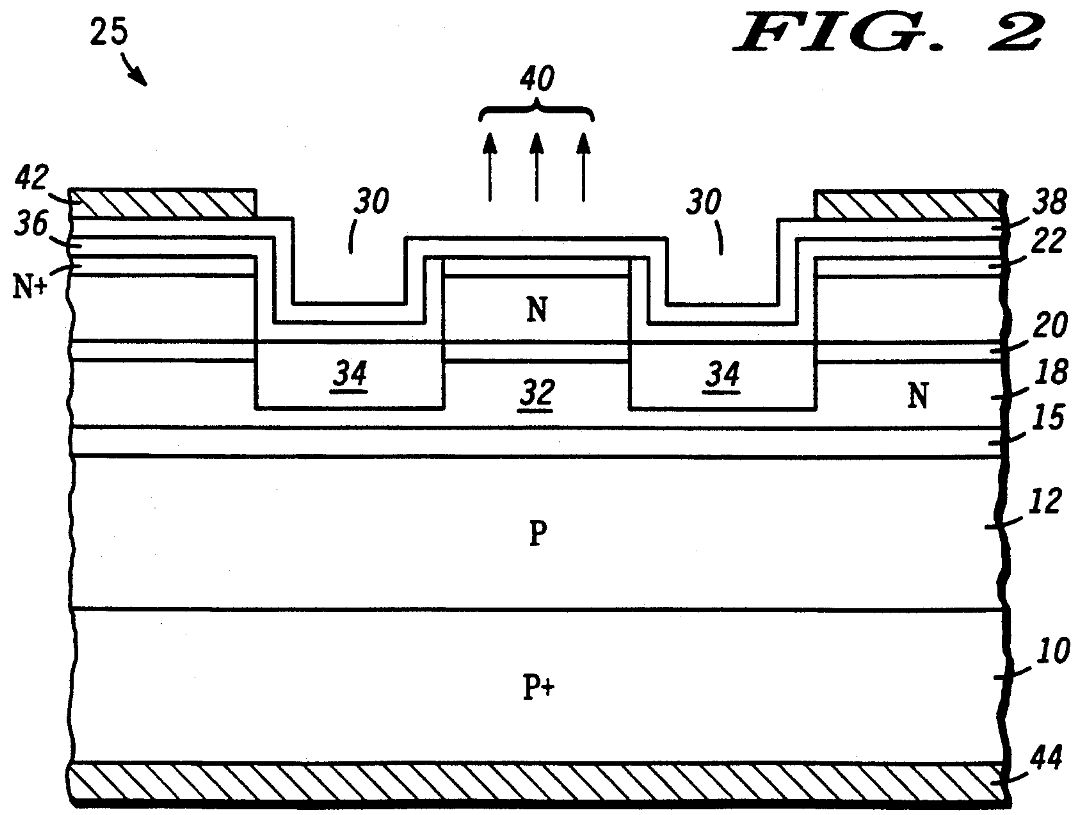
FIG. 2 is a simplified cross sectional view of a complete VCSEL constructed in accordance with the present invention.

Referring specifically to FIG. 2, a simplified cross sectional view of a completed top emitting VCSEL 25 constructed in accordance with the present invention is illustrated. Once the structure of FIG. 1 is completed, the structure must be patterned to form one or more individual VCSELs. It should of course be understood that substrate 10 may be an entire semiconductor wafer containing thousands of VCSELs, all of which are being manufactured simultaneously. In the present specific embodiment the patterning is accomplished as follows. The upper surface of layer 22 is provided with a layer of photoresist material (not shown) in any of the well known methods. The photoresist layer is exposed and material is removed to define the position and size of a trench 30.

Trench 30 is then formed by etching layer 22 and parallel mirror stack 18 as follows. The etch starts with an anisotropic etch such as RIE or CAIBE (chemically assisted ion beam etching) to create a substantially vertical slope. The initial etch step removes most of the material. As a final etch step, a typical AlGaAs wet etch is utilized which stops at the InGaP etch stop layer 20.

The specific wet etch utilized in this embodiment is $H_3PO_4$, $H_2O_2$ and $H_2O$. It will be understood, however, that other etches may be utilized and especially when other materials are utilized for parallel mirror stacks 12 and 18 and for etch stop layer 20. In particular, RIE etching utilizing chlorine can provide enough selectivity to make the etch stop layer effective. The above identified patent '092 describes etching techniques in detail and is incorporated herein by reference.

In general, trench 30 extends completely around and defines an operating area, or mesa, 32 which in this specific embodiment has a generally circular cross section. Trench 30 extends through layer 22 and into parallel mirror stack 18 to a depth of almost one half the complete dimension of parallel mirror stack 18. While this depth is convenient for purposes of illustration and current confinement, it is only necessary that trench 30 be sufficiently deep to reduce reflectivity of parallel mirror stack 18 in the volume between the bottom of trench 30 and active layer 15 so that lasing in that volume is not supported. It should be noted that the optical mode of operation of VCSEL 25 is generally determined by the depth to which trench 30 is etched. Additional information as to the formation of trench 30 is included in a copending application entitled "Patterned Mirror Vertical Cavity Surface Emitting Laser", filed Mar. 26, 1992, with Ser. No. 07/858,288 and assigned to the same assignee.

In the present method of manufacture, the optimum waveguide size for the lowest order mode is predetermined and the diameter of operating area 32 is set equal thereto. Since lasing only occurs within the volume of operating area 32, masking the structure for etching of trench 30 is not crucial and alignment is minimal. In general the depth of trench 30 is such that no contact with active layer 15 is made, so that reliability is enhanced. Also, the width of trench 30 is not crucial and may be any convenient width, depending upon the application and following manufacturing steps.

With trench 30 formed to the desired depth and utilizing the same photoresist mask, an oxygen implant 34 is optionally formed in the bottom thereof and annealed to form a high resistance area to current flow. Implant 34 confines current flow within laser 25 to a volume generally beneath operating area 32. Also, this volume within laser 25 generally defines the area within which lasing occurs because of the reflectivity reduction produced by trench 30. Implant 34 controls current spreading independent of the depth of trench 30.

A dielectric layer 36 of material is formed over the entire structure. In the present embodiment dielectric layer 36 is formed of silicon nitride (SiN) but may be any convenient nonconducting material, such as nitrides or oxides. A contact via is opened over the operating area 32 by means of a second photoresist mask, not shown. The alignment of the second photoresist mask is rendered noncritical by spinning the photoresist onto the surface of the structure. Spinning the photoresist on the surface has a planarizing nature which leaves a much thicker layer of photoresist in trench 30 than on the other surfaces. The thicker photoresist in trench 30 is not fully developed by the exposure light because of the finite penetration depth of the exposure light and the undeveloped material remains in trench 30 after removal of developed material.

A layer 38 of transparent metal, such as indium tin oxide (ITO), is then applied to the surface of the structure to form the top ohmic contact. ITO is transparent to light and does not effect the emission of light, indicated by arrows 40, from the top surface of operating area 32. An overlay metalization layer 42 of traditional metal, such as Ti/Pt/Au is then applied to the upper surface of the structure to form interconnects and bond pads. A layer 44 of traditional metal is also applied to the lower surface of substrate 10 to form a lower electrical contact.

Thus, a top emitting VCSEL is disclosed which is easier to construct. The VCSEL is constructed by forming an etch stop layer in the upper parallel mirror stack during formation of the stack. The etch stop layer is very accurately positioned during epitaxial growth of the upper parallel stack and very accurately stops the etch at the precise depth required. The etch stop layer with a thickness chosen to be a multiple of $\frac{1}{4}$ of the wavelength of the laser light within the layer, is transparent to light reflected within the VCSEL and contributes to the overall reflectivity of the top mirror stack in addition to improving the accuracy of construction. Improving the accuracy and simplifying the construction improves the efficiency of operation and of manufacture.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of producing a top emitting vertical cavity surface emitting laser including the steps of:

providing a substrate having a major surface;

forming a first parallel mirror stack on the major surface of the substrate and parallel therewith;

forming an active and spacer layer on the first parallel mirror stack;

forming a second parallel mirror stack on the active and spacer layer with an emitting surface and a layer of etch stop material positioned within the second parallel mirror stack a predetermined distance from the emitting surface and parallel therewith; and etching a portion of the second parallel mirror stack from the emitting surface to approximately an upper surface of the etch stop layer to define an emitting area.

2. A method of producing a top emitting vertical cavity surface emitting laser as claimed in claim 1 wherein the step of etching includes masking the emitting surface to define the portion of the emitting surface to be etched.

3. A method of producing a top emitting vertical cavity surface emitting laser as claimed in claim 2 wherein the step of masking includes forming a photoresist mask on the emitting surface of the second parallel mirror stack.

4. A method of producing a top emitting vertical cavity surface emitting laser as claimed in claim 1 wherein the step of forming a second parallel mirror stack on the active and spacer layer with an emitting surface and a layer of etch stop material includes forming the layer of etch stop material from indium gallium phosphide.

5. A method of producing a top emitting vertical cavity surface emitting laser as claimed in claim 4 wherein the step of forming the layer of etch stop material includes forming the layer with a thickness equivalent to a multiple of $\frac{1}{4}$ of the optical wavelength of the laser emission within the etch stop material.

6. A method of producing a top emitting vertical cavity surface emitting laser as claimed in claim 4 wherein the step of etching the second parallel mirror stack includes a first step of etching with an anisotropic etch and a second step of etching with a mirror stack wet etch that stops at the etch stop layer.

7. A method of producing a top emitting vertical cavity surface emitting laser as claimed in claim 6 wherein the first step of etching includes using an RIE etch.

8. A method of producing a top emitting vertical cavity surface emitting laser as claimed in claim 6 wherein the first step of etching includes using an ion mill etch.

9. A method of producing a top emitting vertical cavity surface emitting laser as claimed in claim 1 wherein the second step of etching includes using $H_3PO_4$,$H_2O_2$ and $H_2O$.

10. A method of producing a top emitting vertical cavity surface emitting laser as claimed in claim 1 wherein the second step of etching includes using chlorine based RIE.

11. A method of producing a top emitting vertical cavity surface emitting laser as claimed in claim 1 wherein the step of etching a portion of the second parallel mirror stack includes etching a trench in the second parallel mirror stack which surrounds and defines the emitting area.

12. A method of producing a top emitting vertical cavity surface emitting laser as claimed in claim 11 including in addition the step of forming an oxygen/-proton implant in the trench for current confinement.

13. A method of producing a top emitting vertical cavity surface emitting laser as claimed in claim 11 including the step of depositing a layer of dielectric material over the emitting area, the trench and an additional portion of the emitting surface, removing the dielectric material from the emitting area and depositing an electrical conductor over the emitting area and the layer of dielectric material in the trench and the additional portion of the emitting surface.

14. A method of producing a top emitting vertical cavity surface emitting laser as claimed in claim 13 wherein the step of removing the dielectric material from the emitting area includes the steps of spinning a photoresist layer over the emitting area and the trench to form a substantially planar layer of photoresist thereover, developing the photoresist layer to a depth such that the photoresist material on the emitting area is fully developed and the photoresist material in the trench is partially developed and removing the developed photoresist.

15. A method of producing a top emitting vertical cavity surface emitting laser as claimed in claim 14 wherein the step of depositing an electrical conductor over the emitting area and the layer of dielectric material includes the step of forming a layer of transparent metal over the emitting area and the layer of dielectric material.

16. A method of producing a top emitting vertical cavity surface emitting laser as claimed in claim 14 wherein the step of forming a layer of transparent metal over the emitting area and the layer of dielectric material includes the step of forming a layer of indium tin oxide over the emitting area and the layer of dielectric material.

17. A method of producing a top emitting vertical cavity surface emitting laser as claimed in claim 14 wherein the step of depositing an electrical conductor over the emitting area and the layer of dielectric material further includes the step of forming a second layer of electrically conductive metal with a hole in it, on the transparent metal layer over the additional portion of the emitting surface.

18. A method of producing a top emitting vertical cavity surface emitting laser as claimed in claim 17 wherein the step of forming a layer of electrically conductive metal on the transparent metal layer includes forming a layer of Ti/Pt/Au.

19. In a top emitting vertical cavity surface emitting laser comprising:

an active and spacer layer having first and second opposed major surfaces;

a first parallel mirror stack affixed to and parallel with the first major surface and a second parallel mirror stack affixed to and parallel with the second major surface and defining an emitting surface on the second parallel mirror stack opposite the major surface;

a layer of etch stop material positioned within the second parallel mirror stack a predetermined distance from the emitting surface and parallel therewith;

a portion of the second parallel mirror stack being etched from the emitting surface to approximately an upper surface of the etch stop layer with a remaining portion of the second parallel mirror stack defining an emitting area in the emitting surface; and the remaining portion of the second parallel mirror stack being sufficient to promote lasing therein and the etched portion of the second parallel mirror stack being insufficient to promote lasing therein.

20. In a top emitting vertical cavity surface emitting laser as claimed in claim 19 wherein the layer of etch stop material includes indium gallium phosphide.

21. In a top emitting vertical cavity surface emitting laser as claimed in claim 19 wherein the portion of the second parallel mirror stack which is etched defines a channel surrounding the emitting area.

22. In a top emitting vertical cavity surface emitting laser as claimed in claim 21 including an addition a transparent electrical contact positioned on the emitting surface.

23. In a top emitting vertical cavity surface emitting laser as claimed in claim 22 wherein the electrical contact includes a transparent metal.

24. In a top emitting vertical cavity surface emitting laser as claimed in claim 23 wherein the transparent metal includes indium tin oxide positioned over at least the emitting area.

25. In a top emitting vertical cavity surface emitting laser as claimed in claim 24 wherein the layer of indium tin oxide is positioned over the emitting area, the channel defined by the etched portion of the second parallel mirror stack and an additional portion of the emitting surface and a second conducting material is positioned on the additional portion in contact with the indium tin oxide.

26. In a top emitting vertical cavity surface emitting laser as claimed in claim 19 including in addition an oxygen implant positioned beneath the etched portion of the second parallel mirror stack.

* * * * *